United States Patent [19]

Sturdivant

[11] Patent Number: 5,691,566
[45] Date of Patent: Nov. 25, 1997

[54] TAPERED THREE-WIRE LINE VERTICAL CONNECTIONS

[75] Inventor: Rick Sturdivant, Placentia, Calif.

[73] Assignee: Hughes Electronics, Los Angeles, Calif.

[21] Appl. No.: 621,670

[22] Filed: Mar. 25, 1996

[51] Int. Cl.⁶ .......................... H01L 29/40; H01L 23/58
[52] U.S. Cl. .................. 257/664; 257/665; 257/775
[58] Field of Search ........................... 257/664, 665, 257/775

[56] References Cited

U.S. PATENT DOCUMENTS

| | | | |
|---|---|---|---|
| 4,601,781 | 7/1986 | Mercier et al. | 257/775 |
| 4,833,521 | 5/1989 | Early | 257/664 |
| 4,905,068 | 2/1990 | Satoh et al. | 257/775 |
| 5,027,174 | 6/1991 | Mimoto | 257/665 |
| 5,043,792 | 8/1991 | Adachi | 257/665 |
| 5,539,247 | 7/1996 | Cheung et al. | 257/775 |

OTHER PUBLICATIONS

Cavaliere et al, IBM Tech Dis. Bull. vol. 21 No. 12 May 1979 p. 4827.
"Ceramic multichip modules," B. Hargis, *Inside ISHM*, Mar./Apr. 1993, pp. 15–18.
"Low loss, low temperature cofired ceramic for microwave multichip modules," A. Piloto et al., Proc. 1994 ISHM Symposium, pp. 318–323.

*Primary Examiner*—Tom Thomas
*Assistant Examiner*—David Ostrowski
*Attorney, Agent, or Firm*—Leonard A. Alkov; Wanda K. Denson-Low

[57] ABSTRACT

An electrical connection is provided between a 3-wire transmission line buried in a dielectric substrate and corresponding first, second and third conductive pads formed on a substrate surface. The 3-wire line includes first, second and third wires having a wire cross-sectional dimension. A tapered section connects each wire of the 3-wire line to a corresponding pad. Each tapered section increases in cross-sectional dimension from a first end connected to an end of the wire and a second end connected to a pad. The tapered sections provide a smooth transition of electromagnetic fields between the 3-wire line and the pads.

16 Claims, 2 Drawing Sheets

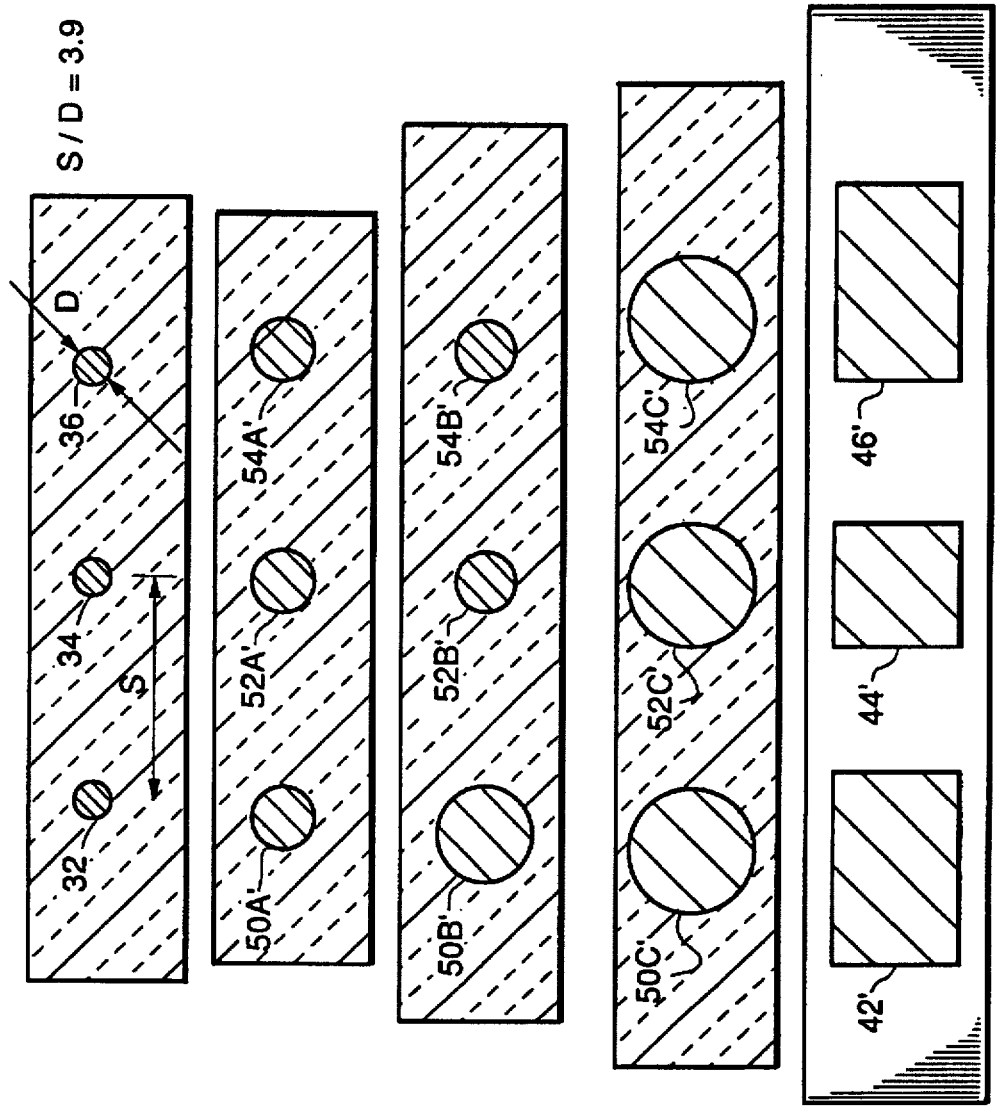

TAPERED THREE-WIRE LINE VERTICAL CONNECTIONS

TECHNICAL FIELD OF THE INVENTION

This invention relates to RF connectors, and more particularly to connection from three-wire line buried in a substrate to connecting pads on a surface of the substrate.

BACKGROUND OF THE INVENTION

Active radar array systems employ transmit/receive (T/R) modules which are connected to a respective radiating element. The arrangement used in T/R modules to connect buried 3-wire line to the connecting top surface of the substrate requires landing pads for the connection. Without the addition of a taper in accordance with the invention, the connection would have poor electrical performance.

SUMMARY OF THE INVENTION

An electrical connection is provided between a 3-wire transmission line buried in a dielectric substrate and corresponding first, second and third conductive pads formed on a substrate surface. The 3-wire line includes first, second and third wires having a wire cross-sectional dimension. A tapered section connects each wire of the 3-wire line to a corresponding pad. Each tapered section increases in cross-sectional dimension from a first end connected to an end of the wire and a second end connected to a pad. The tapered sections provide a smooth transition of electromagnetic fields between the 3-wire line and the pads.

The tapered sections comprise a plurality of sub-sections each having a fixed constant cross-sectional dimension. The cross-sectional dimension of the respective sub-sections increases from the dimension for the sub-section connected to an end of a wire to the dimension for the sub-section connected to the pad.

BRIEF DESCRIPTION OF THE DRAWING

These and other features and advantages of the present invention will become more apparent from the following detailed description of an exemplary embodiment thereof, as illustrated in the accompanying drawings, in which:

FIG. 3A is a cross-section taken through line 3A—3A of FIG. 2.

FIG. 3B is a cross-section taken through line 3B—3B of FIG. 1.

FIG. 3C is a cross-section taken through line 3C—3C of FIG. 2.

FIG. 3D is a cross-section taken through line 3D—3D of FIG. 2.

FIG. 3E is a cross-sectional view taken through line 3E—3E of FIG. 2.

DETAILED DESCRIPTION OF THE PREFERRED EMBODIMENT

A connection from 3-wire line to connecting pads is described. It allows for the connection of the rf signal traveling along the 3-wire line to the surface of the board. This is a completely new approach, a new connection type. Also, a taper can be added to the 3-wire line as it transitions into the pads. This allows for the smooth transition of the fields.

The arrangement used in T/R modules to connect buried 3-wire line to the connecting top surface of the substrate requires landing pads for the connection. Without the addition of a taper in accordance with the invention, the connection has poor electrical performance.

Figure 1:
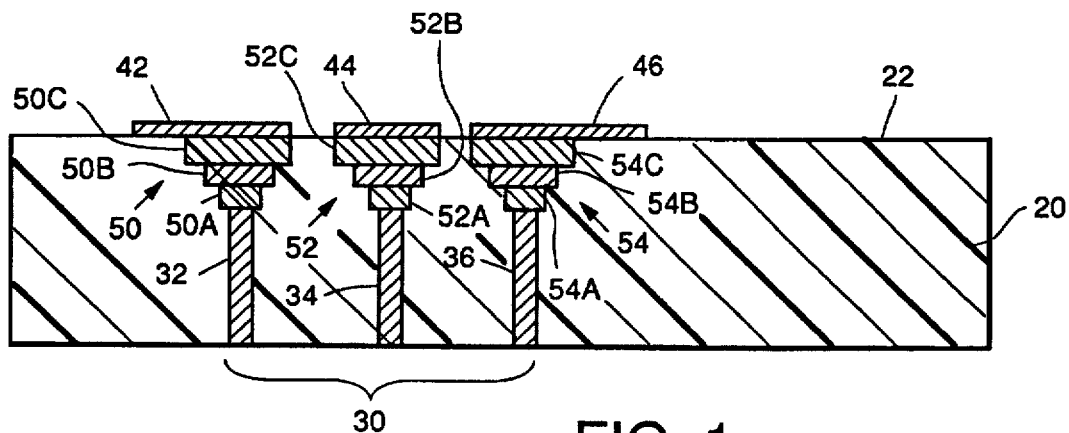
FIG. 1 is a simplified schematic diagram showing a connection between a 3-wire line buried in a substrate and conductive pads formed on a surface of the substrate.

FIG. 1 illustrates an exemplary embodiment of the invention. A dielectric substrate 20 as a top surface 22 and a buried 3-wire line 30 which carries rf signals. The line 30 is formed by three wires 32, 34 and 36 which are buried within the substrate 20. The wires are aligned in parallel within the substrate 20, and extend orthogonally to the surface 22 in this exemplary embodiment. The middle wire 34 is the signal line, and the two outer lines 32, 36 are ground lines connected to rf ground.

In this exemplary embodiment, the wires are fabricated by forming holes, e.g. by punching, in the substrate, which is in a soft state, and filling the holes with metal in a liquid form. These filled holes form vias in the substrate. The substrate is then fired (baked at high temperature) until the substrate and vias are cured into a solid ceramic with solid metal vias. By stacking the substrates before firing, multiple layers are formed which allows for various via formations. Fabrication of multilayer substrates, wherein e.g. the substrate material is aluminum nitrate or low temperature cofired ceramic, is well known in the art. See, e.g., "Ceramic multichip modules," B. Hargis, *Inside ISHM*, March/April 1993, pp. 15–18, and "Low loss, low temperature cofired ceramic for microwave multichip modules," A. Piloto, et al., Proc. 1994 ISHM Symposium, pp. 318–323.

The wires 32, 34, 36 have a circular cross-sectional configuration, and in an exemplary embodiment have a diameter of 0.008 inches and spacing of 0.031 inches. Of course, the dimensions of the wires and spacing between wires is a function of the dielectric material forming the substrate and the desired line impedance. Once the dielectric material, line impedance and wire diameter has been chosen, the wire spacing can be determined empirically or by simulation.

For exemplary applications, e.g. a T/R module, conductive surface pads 42, 44 and 46 are used to make electrical connection with the 3-wire line. Other circuits (not shown) can be connected to the pads.

In accordance with the invention, the 3-wire line 30 includes tapered wire sections 50, 52 and 54 which introduce a taper in the cross-sectional dimension of the buried wires 32, 34 and 36 to provide a smooth transition of the electromagnetic fields of the rf signals between the wires and the pads, thereby improving performance of the connection to the pads. Each sub-section has an effective electrical length, in an exemplary embodiment, of approximately 4.4 degrees, with the complete tapered section providing an electrical length of approximately 13.2 degrees.

In this exemplary embodiment, each tapered wire section includes three sub-sections of progressively increasing cross-sectional dimension. Thus, section 50 includes sub-sections 50A, 50B and 50C, section 52 includes sub-sections 52A, 52B and 52C, and section 54 includes sub-sections 54A, 54B and 54C. Each of the sub-sections in turn has a circular cross-sectional configuration; in this exemplary embodiment, the sub-sections themselves are not tapered. That is because the exemplary embodiment is fabricated from a series of vias which are stacked on top of each other during a multilayering process. Thus, each via in a given layer has a particular diameter, which is different for each of the sub-sections forming the tapered section. Each series of vias forming a wire and corresponding tapered wire section are fused together during the firing process.

Each tapered section 50, 52 and 54 has a first end connected to an end of the corresponding wire 32, 34 and 36, and a second end connected to an undersurface of the corresponding pad 42, 44 and 46. Each of the connections are made during the firing process in this exemplary embodiment. In other embodiments, the connections could be by soldering. Also, instead of using stepped tapered sections, continuously tapered sections could also be employed.

FIGS. 2 and 3A–3E illustrate an alternate embodiment of the invention. Particularly, this embodiment illustrates a particular multilayer fabrication, wherein region 20A illustrates in general the plurality of layers which have been assembled to define the 3-wire line 30 and its wires 32, 34 and 36, and regions 20B-20D indicate layers for the respective tapered line sub-sections 52'-54'. This embodiment differs from that of FIG. 1 in that the respective outer tapered sub-sections 50' and 54' are not coaxial with the axis of the respective wires, but instead are offset so that the inside edge of the respective tapered sub-section is aligned with the inside edge of the respective wire. The tapered sub-sections 52A'-52C' are collinear with the center wire 34.

Figure 2:
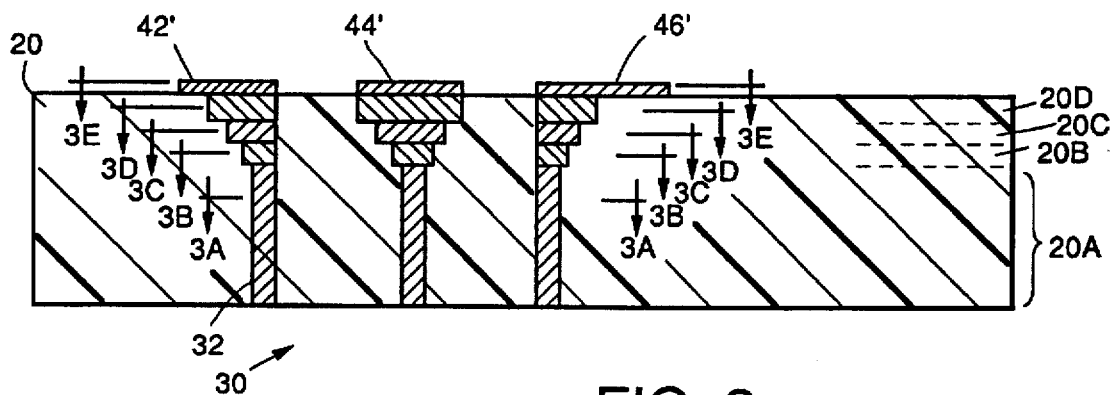
FIG. 2 is a simplified schematic diagram showing an alternate embodiment of the invention.

FIG. 3A is a cross-section taken through line 3A—3A of FIG. 2, and illustrates the circular cross-sectional configuration of the wires 32, 34 and 36.

FIG. 3B is a cross-section taken through line 3B—3B of FIG. 1, and illustrates the tapered sub-sections 50A', 52A' and 54A'.

FIG. 3C is a cross-section taken through line 3C—3C of FIG. 2, and illustrates the sub-sections 50B', 52B' and 54B'. FIG. 3D is a cross-section taken through line 3D—3D of FIG. 2, and illustrates the sub-sections 50C', 52C' and 54C'.

FIG. 3E is a cross-sectional view taken through line 3E—3E of FIG. 2, and illustrates the lateral extent of the pads 42', 44' and 46'. In this exemplary embodiment, the sub-section 52C' has a diameter equal to the length of each side of the square pad 44'.

FIGS. 3A—3D show the diameters of the corresponding tapered sections at a particular layer to be equal. In alternate embodiments, the center and outer conductors of the tapered sections could be of unequal diameters. This alternate embodiment would be useful if a significant change in line impedance is necessary to match into the pad impedance using the first design technique described below.

There are two general techniques which can be used to select the electrical length, diameter and spacing of the tapered sections. The first is based on an impedance matching technique. By knowing the load impedance present at the landing pads 42, 44 and 46, the required impedance and electrical length of transmission lines which are able to match into the landing pad impedance can be obtained. Each tapered section performs as a match transmission line element. To generate a design using this technique, one would start by obtaining the impedance at the landing pads by modeling or measurement. The electrical length and line impedance of the tapered sections are obtained by using impedance matching theory, computer modeling, or experimentation. The circular diameters of the tapered sub-sections are generally chosen to be convenient values based on substrate fabrication considerations. Once the line impedance and taper diameter are known, the spacing between the wires in the tapered sections can be obtained. The physical length of the tapered sections is obtained from the required electrical length and the phase velocity within the substrate. This technique is particularly useful at high microwave or millimeter-wave frequencies. FIG. 1 illustrates the case of an impedance varying taper, wherein the tapered sections transform the line impedance of the 3-wire line 30 to the load impedance presented at the landing pads 42, 44, 46.

A second technique involves providing a constant, or near constant, line impedance transformation into the pads which, in this case, presents a very small impedance mismatch, i.e. there is a very small impedance mismatch between the load impedance presented at the pads and the characteristic impedance of the 3-wire line, typically 50 ohms. FIG. 2 illustrates a near constant impedance field transition. By "near constant" impedance (typically near 50 ohms) is meant that the tapered sections present a VSWR which is less than 1.2:1 relative to the impedance of the 3-wire line 30. By providing a smooth physical transition with constant or near constant line impedance, the electromagnetic fields transition easily into the pads. The advantage of this case is that the performance is very broad band. The disadvantage is that the pads do not always present a small mismatch, typically for very high frequency applications, and in this case the first design technique described above would typically be used.

Both techniques provide a smooth transition of the electromagnetic energy, but the design approach and performance differ slightly.

Figure 4:
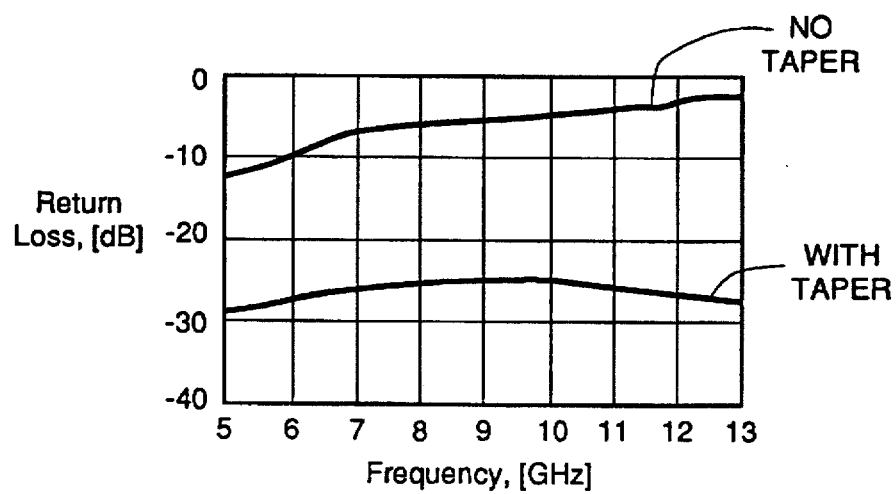
FIG. 4 is a plot of return loss as a function of frequency obtained in a simulation of the connection of FIG. 1.

The circuit shown in FIG. 1 has been modeled in a simulation, shown in FIG. 4, where the return loss (dB) as a function of frequency is shown. The connection of the 3-wire line to the pads with the tapered sections provides improved performance over connections made directly from the 3-wire line to the pads.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. An electrical rf connection between an rf 3-wire transmission line buried in a dielectric substrate and corresponding conductive pads formed on a substrate surface, the 3-wire line including first, second and third wires having a wire cross-sectional dimension, including for each wire of the 3-wire line a tapered section connecting the wire to a corresponding pad, each tapered section changing in cross-sectional dimension from a first dimension at a first end connected to an end of the wire and a second dimension at a second end connected to a pad, wherein the tapered sections provide a smooth transition of electromagnetic fields between said 3-wire line and said pads.

2. The invention of claim 1 wherein the first, second and third wires are orthogonal to the substrate surface.

3. The invention of claim 1 wherein the surface pads have a surface area at least as large as an area subtended by said second end of the tapered sections.

4. The invention of claim 1 wherein the tapered sections comprise a plurality of sub-sections each having a fixed constant cross-sectional dimension, and wherein the cross-sectional dimension of the respective sub-sections increases from the dimension for the sub-section connected to an end of a wire to the dimension for the sub-section connected to the pad.

5. The invention of claim 4 wherein each of said sub-sections defining a given tapered section are collinear with a center axis of a corresponding wire.

6. The invention of claim 4 wherein each of said subsections defining said first and third tapered sections are not collinear with each other or with a center axis of a corresponding wire.

7. The invention of claim 1 wherein said tapered sections effect an impedance transformation between a characteristic impedance of said 3-wire line and a load impedance established at said first, second and third pads.

8. The invention of claim 1 wherein said tapered sections provide a near constant impedance field transition between said wires of said 3-wire line and said pads.

9. An rf signal connection circuit, comprising:

a dielectric substrate having a substrate surface;

an rf 3-wire transmission line buried in said dielectric substrate, said transmission line comprising a center wire and first and second outer wires, said center wire and said outer wires in parallel alignment and extending orthogonally to said substrate surface and having a wire cross-sectional dimension;

first, second and third conductive pads formed on said substrate surface; and first, second and third tapered wire sections respectively connecting a wire to a corresponding pad, each tapered section changing in cross-sectional dimension from a first dimension at a first end connected to an end of the wire and a second dimension at a second end connected to a pad, wherein the tapered sections provide a smooth transition of electromagnetic fields between said 3-wire line and said pads.

10. The invention of claim 9 wherein the surface pads have a surface area at least as large as an area subtended by said second end of the tapered sections.

11. The invention of claim 9 wherein the tapered sections comprise a plurality of sub-sections each having a fixed constant cross-sectional dimension, and wherein the cross-sectional dimension of the respective sub-sections increases from the dimension for the sub-section connected to an end of a wire to the dimension for the sub-section connected to the pad.

12. The invention of claim 11 wherein each of said sub-sections defining a given tapered section are collinear with a center axis of a corresponding wire.

13. The invention of claim 11 wherein each of said sub-sections defining said first and third tapered sections are not collinear with each other or with a center axis of a corresponding wire.

14. The invention of claim 9 wherein said tapered sections effect an impedance transformation between a characteristic impedance of said 3-wire line and a load impedance established at said first, second and third pads.

15. The invention of claim 9 wherein said tapered sections provide a near constant impedance field transition between said wires of said 3-wire line and said pads.

16. The invention of claim 9 wherein said substrate is fabricated from multiple substrate layers and said wires of the 3-wire line and the tapered section are fabricated as conductive vias in the multiple substrate layers.

* * * * *